(12) United States Patent
Sekiguchi et al.

(10) Patent No.: US 7,245,894 B2
(45) Date of Patent: Jul. 17, 2007

(54) RADIO RECEIVER AND RADIO SIGNAL PROCESSING METHOD WITH CONTROLLING GAIN

(75) Inventors: Takahiro Sekiguchi, Kanagawa-ken (JP); Hiroshi Yoshida, Kanagawa-Ken (JP); Ichiro Seto, Tokyo (JP); Takehiko Toyoda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 324 days.

(21) Appl. No.: 10/819,288

(22) Filed: Apr. 7, 2004

(65) Prior Publication Data

US 2005/0009489 A1 Jan. 13, 2005

(30) Foreign Application Priority Data

Apr. 25, 2003 (JP) ............................. 2003-122316

(51) Int. Cl.
*H04B 1/06* (2006.01)
(52) U.S. Cl. ............................... 455/242.1; 455/242.2; 455/251.1; 375/345
(58) Field of Classification Search .. 455/232.1–252.1, 455/253.2, 296, 310, 311, 334; 325/345
See application file for complete search history.

(56) References Cited

U.S. PATENT DOCUMENTS

| 6,205,189 | B1 * | 3/2001 | Ha ............................. 375/345 |
| 6,459,889 | B1 * | 10/2002 | Ruelke ....................... 455/296 |
| 6,748,200 | B1 * | 6/2004 | Webster et al. ........... 455/234.1 |
| 6,885,852 | B2 * | 4/2005 | Hughes et al. ............ 455/234.1 |
| 6,950,641 | B2 * | 9/2005 | Gu ............................. 455/241.1 |
| 6,963,733 | B2 * | 11/2005 | Eriksson et al. ............ 455/132 |
| 7,076,225 | B2 * | 7/2006 | Li et al. .................. 455/245.1 |
| 2003/0064696 | A1 * | 4/2003 | Akamine et al. ........... 455/311 |
| 2003/0207675 | A1 * | 11/2003 | Hughes et al. ........... 455/234.1 |
| 2004/0097209 | A1 * | 5/2004 | Haub et al. .............. 455/242.1 |
| 2005/0070240 | A1 * | 3/2005 | Adler et al. ............. 455/232.1 |
| 2005/0186928 | A1 * | 8/2005 | Miura ..................... 455/234.1 |

(Continued)

FOREIGN PATENT DOCUMENTS

JP 2002-76805 3/2002

(Continued)

OTHER PUBLICATIONS

H. Tanimoto, IEICE Trans. Electron., vol. J64-C, No. 5, pp. 337-348, "Mission Impossible? A Review of Mixers for Direct-Conversion Receivers", May 2001.

(Continued)

*Primary Examiner*—Edward F. Urban
*Assistant Examiner*—Blane J. Jackson
(74) *Attorney, Agent, or Firm*—Oblon, Spivak, McClelland, Maier & Neustadt, P.C.

(57) ABSTRACT

A radio receiver comprises a first amplifier to amplify a received radio signal; a quadrature demodulator to demodulate the radio signal amplified by said first amplifier and thereby generate a baseband signal; a second amplifier to amplify the baseband signal; a demodulator to demodulate the baseband signal amplified by said second amplifier; and a gain controller to control timing of a change in a gain of said second amplifier, in case that changing the gain of said first amplifier and the gain of said second amplifier, on the basis of a gain of said first amplifier before and after the change.

11 Claims, 9 Drawing Sheets

U.S. PATENT DOCUMENTS

2005/0208919 A1* 9/2005 Walker et al. .............. 455/296

FOREIGN PATENT DOCUMENTS

| JP | 2002-94346 | 3/2002 |
|----|------------|--------|
| WO | WO 01/47105 A2 | 6/2001 |
| WO | WO 02/067420 A2 | 8/2002 |

OTHER PUBLICATIONS

U.S. Appl. No. 10/327,104, filed Dec. 24, 2002, Toyoda et al.
U.S. Appl. No. 10/819,288, filed Apr. 7, 2004, Sekiguchi et al.
U.S. Appl. No. 11/280,331, filed Nov. 17, 2005, Toyoda et al.
U.S. Appl. No. 11/280,315, filed Nov. 17, 2005, Toyoda et al.

* cited by examiner

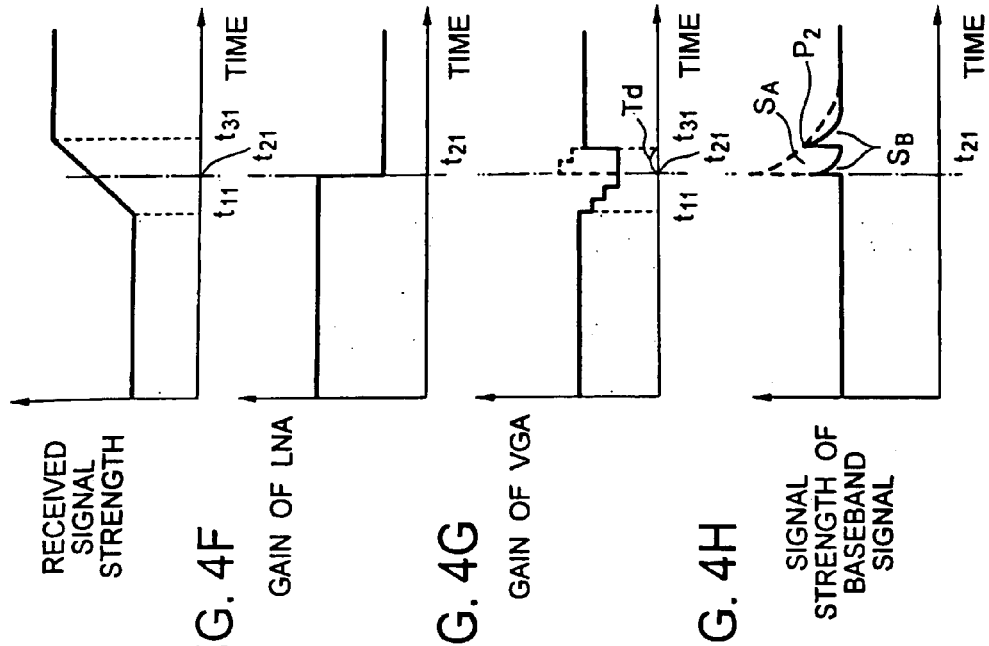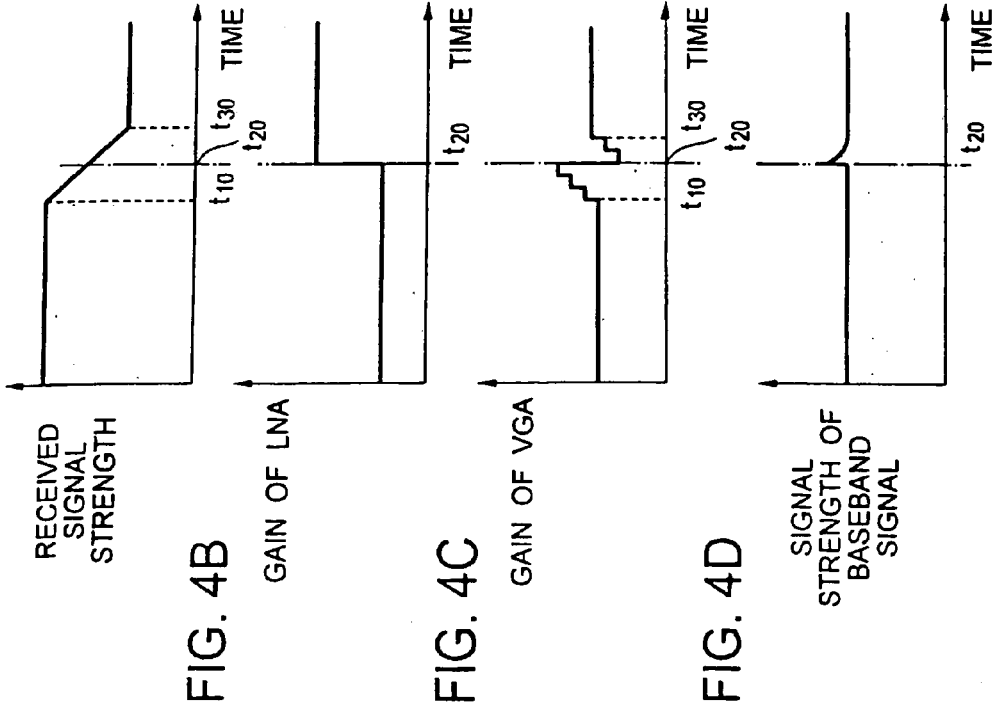

RADIO RECEIVER AND RADIO SIGNAL PROCESSING METHOD WITH CONTROLLING GAIN

CROSS-REFERENCE TO RELATED APPLICATION

This application is based upon and claims the benefit of priority from the prior Japanese Patent Application No. 2003-122316, filed on Apr. 25, 2003, the entire contents of which are incorporated herein by reference.

BACKGROUND OF THE INVENTION

1. Field of the Invention

The present invention relates to a radio receiver and a radio signal processing method.

2. Related Background Art

In recent years, radio communication devices have widely spread. As a result, it is increasingly demanded to reduce the number of components and the manufacture cost for a radio circuit and manufacture the radio circuit as a monolithic IC. In order to cope with this demand, the direct conversion scheme is adopted for the radio circuits.

FIG. 8 is a block diagram of a conventional receiver adopting the direct conversion scheme. An antenna 10 receives an RF (Radio Frequency) signal, and an LNA (Low Noise Amplifier) 20 amplifies this RF signal. A quadrature demodulator 30 multiplies the amplified RF signal by an LO (Local Oscillator) signal supplied from a local oscillator (not illustrated). As a result, the RF signal is directly converted to a baseband signal. An LPF (Low Pass Filer) 40 conducts waveform shaping on the baseband signal, and a VGA (Variable Gain Amplifier) 50 amplifies this baseband signal. In addition, a demodulator 70 demodulates this baseband signal to a digital signal. In this way, the receiver using the direct conversion scheme converts the RF signal to a digital signal, and then demodulates it by using digital signal processing.

The baseband signal amplified by the VGA 50 is input not only to the demodulator 70 but also to a gain controller 60 and a DC offset canceller 94. In the gain controller 60, a signal strength detector 80 measures the strength of the baseband signal. A gain selector 90 decides whether to switch the gain of the LNA 20 and the gain of the VGA 50 on the basis of the measured value of the baseband signal. A gain control signal generator 92 outputs a gain control signal to the LNA 20 and the VGA 50 to switch the gain in accordance with the decision made by the gain selector 90. In this way, the gain controller 60 effects feedback control on the strength of the baseband signal.

The DC (Direct Current) offset canceller 94 removes a DC offset component from the baseband signal amplified by the VGA 50, and feeds back this to the VGA 50. By the way, problems concerning the DC offset component are described in "Research development tendency of mixer for direct conversion receiver ("Mission Impossible ? A Review of Mixers for Direct-Conversion Receivers")" written by Hiroshi Tanimoto, The Transactions of the Institute of Electronics, Information, and Communication Engineers, section C, Vol. J84-C, No. 5, pp. 337–348, May 2001.

FIGS. 9A and 9B are graphs showing gains of the LNA 20 and the VGA 50, respectively. FIG. 9C is a graph showing a transient response component of a DC offset in the output of the VGA 50. The gains of the LNA 20 and the VGA 50 are simultaneously switched.

When the LNA 20 is switched from a high gain to a low gain at a point $t_1$ in time, the VGA 50 is switched simultaneously from a low gain to a high gain. In some cases, therefore, DC offsets of both the LNA 20 and the VGA 50 overlap each other, and a very large transient response component occurs, resulting in a degraded reception performance. This is because the LNA 20 is disposed in a stage in the radio circuit preceding the VGA 50, and consequently the transient response component of the DC offset generated in the LNA 20 is amplified by the high gain obtained after the change in the VGA 50.

SUMMARY OF THE INVENTION

An advantage of an aspect of the present invention is to provide a radio receiver of direct conversion scheme in which degradation of the reception performance caused by the transient response component of the DC offset is suppressed.

A radio receiver of an embodiment accordance with the instant invention comprises a first amplifier to amplify a received radio signal; a demodulation circuit line comprising a quadrature demodulator to demodulate the radio signal amplified by said first amplifier and to generate a baseband signal, a second amplifier to amplify the baseband signal, and a demodulator to demodulate the baseband signal amplified by said second amplifier; and a gain controller to control timing of a change in a gain of said second amplifier, in case that the gain of said first amplifier and the gain of said second amplifier are changed, on the basis of a gain of said first amplifier before and after the change.

A radio receiver of another embodiment accordance with the instant invention comprises a radio receiver comprising: a first amplifier to amplify a received radio signal; a quadrature demodulator to demodulate the radio signal amplified by said first amplifier and to generate a baseband signal; a second amplifier to amplify, after changing a gain of said first amplifier, the baseband signal with a gain based on a gain of said first amplifier obtained before and after the change; and a demodulator to demodulate the baseband signal amplified by said second amplifier.

A radio receiver of further embodiment accordance with the instant invention comprises a first amplifier to amplify a received radio signal; a quadrature demodulator to demodulate the radio signal amplified by said first amplifier and to generate a baseband signal; a second amplifier to amplify the baseband signal; a demodulator to demodulate the baseband signal amplified by said second amplifier; and a gain controller to delay timing of a change in a gain of said second amplifier as compared with timing of a change in a gain of said first amplifier, in case that the gain of said first amplifier is changed from a high gain to a low gain and the gain of said second amplifier is changed from a low gain to a high gain.

A radio signal processing method of an embodiment accordance with the instant invention comprises: receiving a radio signal; amplifying the radio signal; demodulating the amplified radio signal to a baseband signal; amplifying the baseband signal; demodulating the amplified baseband signal; determining timing of a change in a gain of said first amplifier and a gain of said second amplifier, in case that the gain of said first amplifier and the gain of said second amplifier are changed, on the basis of the gain of said first amplifier obtained before and after the change; and changing the gain of said first amplifier and the gain of said second amplifier in accordance with the determined timing.

DESCRIPTION OF THE DRAWINGS

FIGS. 4A to 4H are time charts showing gains of the LNA 120 and VGA 150 during phasing and signal strengths of a received signal and a baseband signal;

DETAILED DESCRIPTION OF THE INVENTION

Hereafter, embodiments according to the present invention will be described with reference to the drawings. These embodiments do not restrain the present invention. In a radio receiver of a direct conversion scheme according to embodiments of the present invention, the gain of the LNA and the gain of the VGA can be changed respectively at points in time that are different from each other. As a result, the transient response component of the DC offset in the output of the VGA is reduced.

Figure 1:
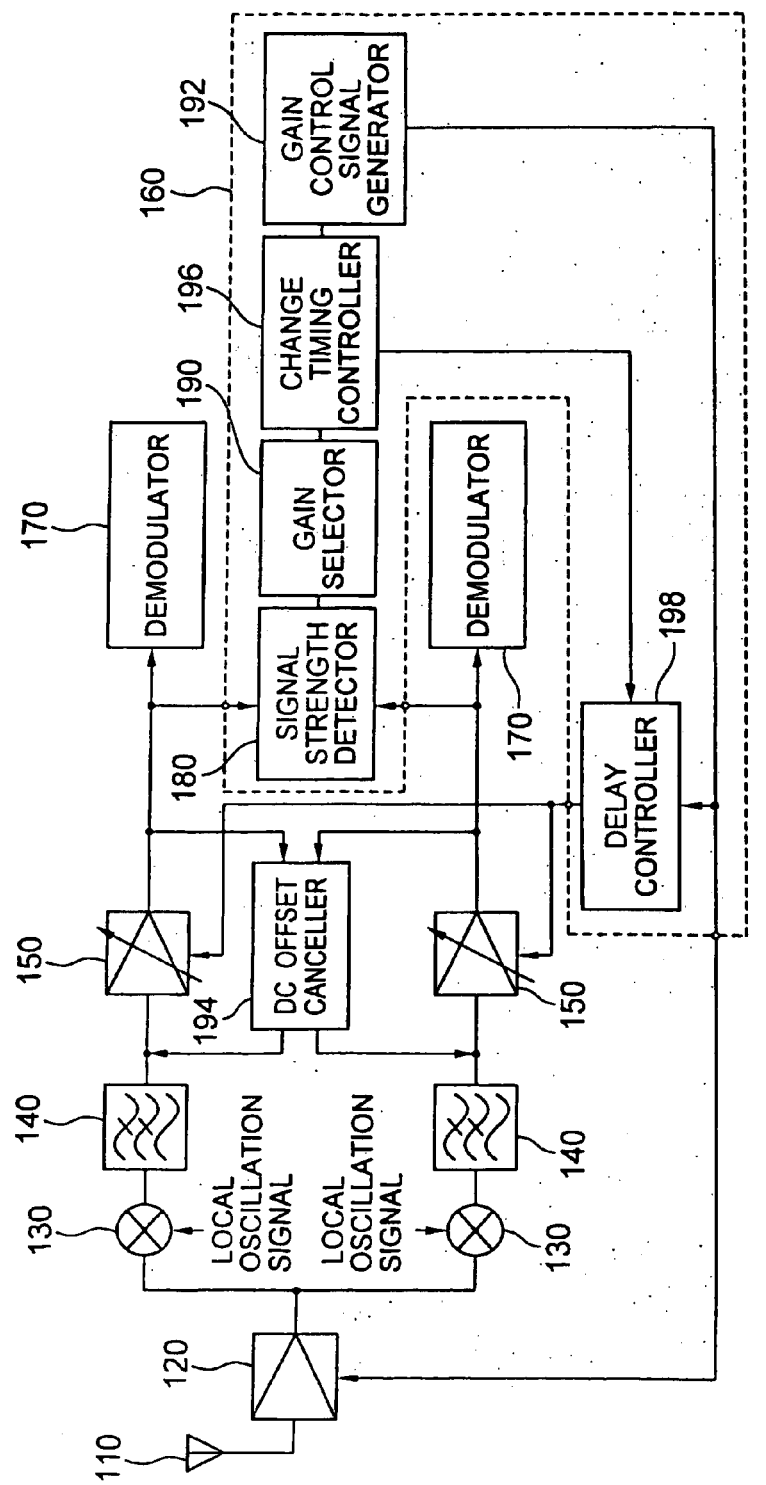
FIG. 1 is a block diagram showing an embodiment according to the present invention.

FIG. 1 is a block diagram of a radio receiver 100 according to an embodiment of the present invention. The radio receiver 100 is a radio receiver using the direct conversion scheme. The direct conversion scheme is a scheme in which an RF signal having a high frequency is converted to a baseband signal having a low frequency without using an intermediate frequency. The radio receiver 100 includes an antenna 110, an LNA 120, a quadrature demodulator 130, an LPF 140, a VGA 150, a gain controller 160, a demodulator 170 and a DC offset canceller 194.

The DC offset canceller 194 is, for example, a circuit formed by connecting an amplifier having a constant gain and an integrator (low pass filter) in cascade. Owing to such a configuration, the DC offset canceller 194 can remove the DC offset component. The DC offset canceller 194 removes a DC offset component contained in the baseband signal, and then feeds back this baseband signal to the VGA 150. The DC offset component is induced by a component of an LO signal that leaks to the antenna 110 and the LNA 120 and undergoes frequency conversion as an input of the quadrature demodulator 130.

Each of the LNA 120 and the VGA 150 is formed so as to be able to be changed stepwise in gain. In the present embodiment, the gain of the LNA 120 can be changed to two levels, i.e., a high-gain level and a low-gain level. The gain of the VGA 150 can be changed to multiple levels between a high gain and a low gain inclusive thereof.

The gain controller 160 is formed so as to effect feedback control on the gains of the LNA 120 and the VGA 150 in order to keep a baseband signal supplied from the VGA 150 at a predetermined signal strength.

The configuration of the gain controller 160 will now be described in more detail. The gain controller 160 includes a signal strength detector 180, a gain selector 190, a change timing controller 196, a gain control signal generator 192 and a delay controller 198. The signal strength detector 180 detects the signal strength of the baseband signal amplified by the VGA 150. The gain selector 190 conducts selection on the gain of the LNA 120 and the gain of the VGA 150 so as to keep the signal strength of the baseband signal detected by the signal strength detector 180 at a constant signal strength. The change timing controller 196 controls timing at which the gain of the VGA 150 should be changed, on the basis of the gain of the LNA 120 selected by the gain selector 190 and the actual gain of the LNA 120 at the current point in time.

The quadrature demodulator 130, the VGA 150 and the demodulator 170 are connected in series. Hereafter, this is referred to as a demodulation circuit line. In the present embodiment, two demodulation circuit lines are connected in parallel after the LNA 120, and used for an I-axis component and a Q-axis component of a received signal, respectively. One gain controller 160 is connected to the two demodulation circuit lines to control the two VGAs 150 in common. For example, the gain controller 160 changes gains of the two VGAs 150 by the same period of time after changing the gain of the LNA 120. The gain controller 160 changes gains of the two VGAs 150 by the same quantity. In this way, the gain controller 160 controls a plurality of demodulation circuit lines in common. As a result, the radio receiver 100 can demodulate the I-axis component and the Q-axis component of the received signal in common.

Figure 2:
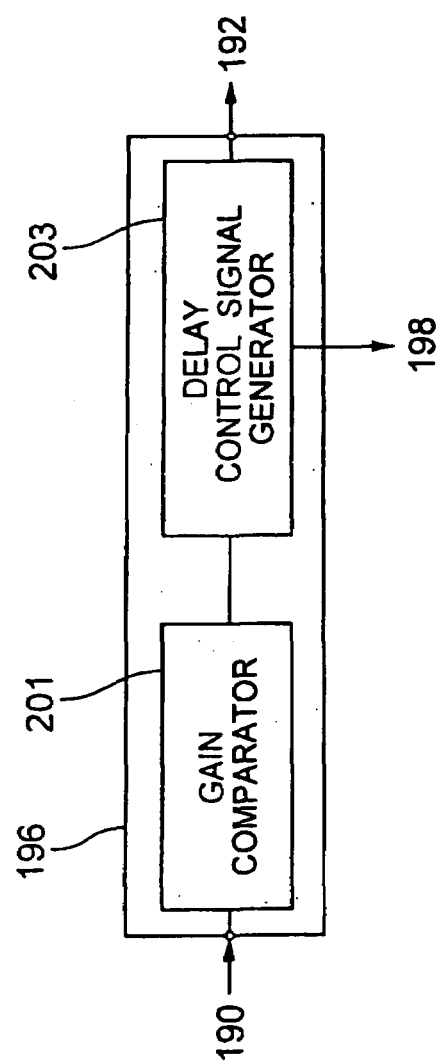
FIG. 2 is a block diagram showing a concrete example of a change timing controller 196.

FIG. 2 shows a concrete example of the change timing controller 196. The change timing controller 196 includes a gain comparator 201 and a delay control signal generator 203.

The gain comparator 201 compares the actual gain of the LNA 120 at the current point in time with the gain of the LNA 120 selected by the gain selector 190. The gain comparator 201 previously stores a certain threshold concerning the gain of the LNA 120. The high gain of the LNA 120 is a gain larger than the threshold, and the low gain is a gain smaller than the threshold. The gain comparator 201 compares the gain of the LNA 120 before a change with the gain of the LNA 120 after the change. Then, with the comparison result, the gain comparator 201 decides whether the gain of the LNA 120 is changed from the high gain to the low gain, the gain of the LNA 120 is changed from the low gain to the high gain, or the gain of the LNA 120 is not changed. Here, the gain of the LNA 120 before the change means the actual gain of the LNA 120 at the current point in time, and the gain of the LNA 120 after the change means the gain of the LNA 120 selected by the gain selector 190. Furthermore, in the present embodiment, changing the gain means switching the gain stepwise. By the way, the gain comparator 201 also previously stores a certain threshold concerning the gain of the VGA 150. The high gain of the VGA 150 is a gain larger than the threshold, and the low gain of the VGA 150 is a gain smaller than the threshold.

The delay control signal generator 203 generates a delay control signal that indicates a delay time used to delay the change in gain of the VGA 150. In the case where the gain of the LNA 120 is changed from the high gain to the low gain, the delay control signal generator 203 generates a delay control signal when the gain of the VGA 150 is changed from the low gain to the high gain. This delay control signal is output to the delay controller 198. On the other hand, in the case where the gain of the LNA 120 is changed from the low gain to the high gain or the gain of the LNA 120 is not changed, the delay control signal generator 203 does not generate the delay control signal when the gain of the VGA 150 is changed.

The gain control signal generator 192 is supplied with the gain selected in the gain selector 190 via the change timing controller 196. The gain control signal generator 192 outputs a gain control signal to the LNA 120 and the delay controller 198 on the basis of the gains of the LNA 120 and the VGA 150 selected by the gain selector 190. The gain control signal is a signal indicating the gains respectively of the LNA 120 and the VGA 150 selected by the gain selector 190.

The delay controller 198 outputs the gain control signal to the VGA 150, after a predetermined delay time has elapsed since a point in time at which the delay controller 198 receives the gain control signal, in accordance with the delay control signal. Since the gain control signal is transmitted directly to the LNA 120, the gain of the VGA 150 is changed with a delay to the gain of the LNA 120. On the other hand, in the case where the delay control signal is not output from the delay control signal generator 203, the delay controller 198 outputs the gain control signal to the VGA 150 without delaying the gain control signal.

In this way, the gain controller 160 is formed so as to control the timing at which the gain of the VGA 150 is changed on the basis of the gain of the LNA 120 before and after the change.

When the gain of the LNA 120 is changed, it is evident in the present embodiment that the gain change of the VGA 150 is brought about. Therefore, the timing at which the gain of the VGA 150 is changed is controlled on the basis of the gain of the LNA 120 before and after the change.

In the case where it is not evident that the gain change of the VGA 150 is brought about when the gain of the LNA 120 is changed, however, the timing at which the gain of the VGA 150 is changed may be controlled on the basis of the gains of the LNA 120 and the VGA 150 before and after the change.

FIGS. 3A to 3F are time charts showing gains of the LNA 120 and the VGA 150, and the signal strength of the baseband signal. With reference to FIGS. 3A to 3F, operation of the LNA 120 and the VGA 150 will now be described in further detail.

Figure 3A:
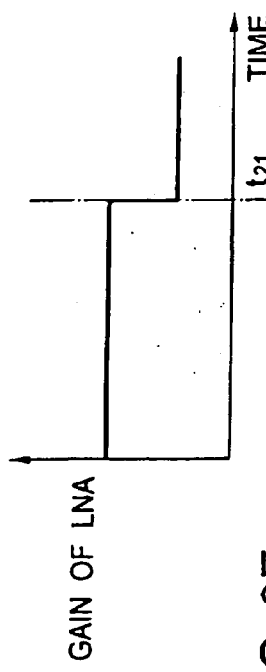
FIGS. 3A to 3F are time charts showing gains of the LNA 120 and VGA 150, and signal strength of a baseband signal.
Figure 3B:
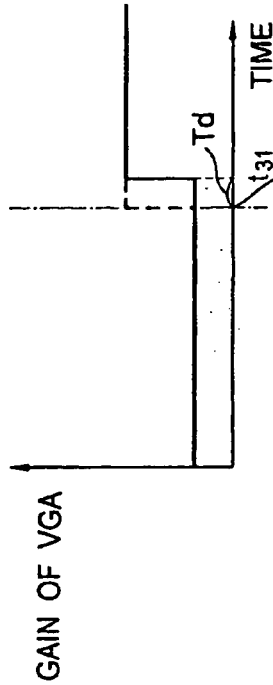
Figure 3C:
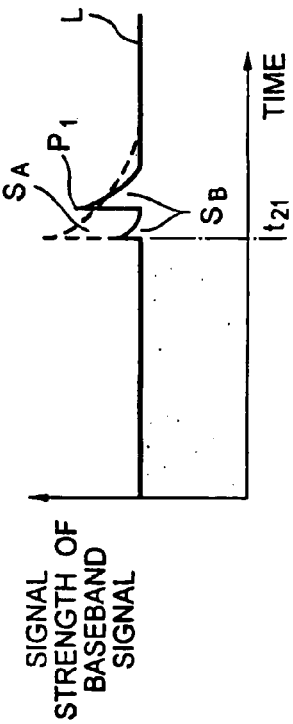

First, the gain of the LNA 120 is changed from the low gain to the high gain as shown in FIG. 3A, and the gain of the VGA 150 is changed from the high gain to the low gain as shown in FIG. 3B. The gains of the LNA 120 and the VGA 150 are changed at a point in time $t_{20}$. A transient response characteristic of the DC offset induced at this time is relatively small as shown in FIG. 3C.

Figure 3D:
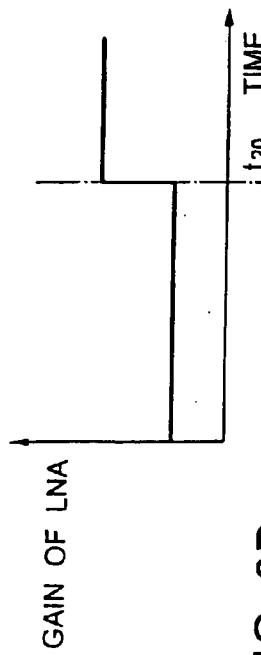
Figure 3E:
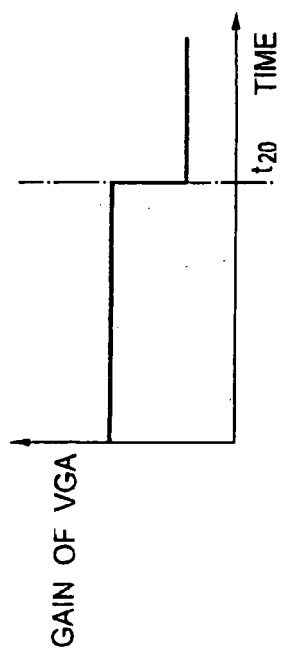

Subsequently, the gain of the LNA 120 is changed from the high gain to the low gain as shown in FIG. 3D, and the gain of the VGA 150 is changed from the low gain to the high gain as shown in FIG. 3E. The gain of the LNA 120 is changed at a point in time $t_{21}$. If at this time the gain of the VGA 150 is changed simultaneously with the change in the gain of the LNA 120 as represented by a broken line in FIG. 3E, a large transient response component of the DC offset is induced as represented by a broken line in FIG. 3F.

Figure 9A:
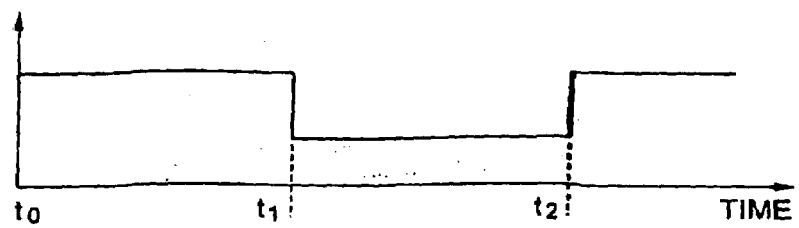
FIGS. 9A to 9C are graphs showing gains of conventional LNA 20 and VGA 50.
Figure 9B:
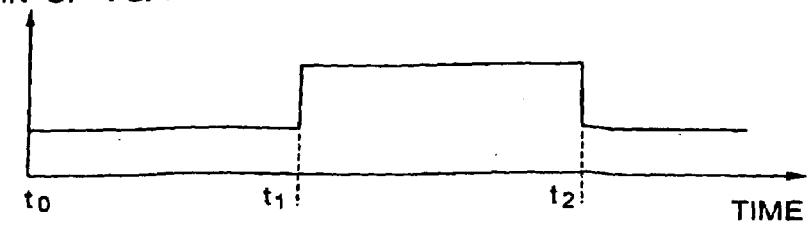
Figure 9C:
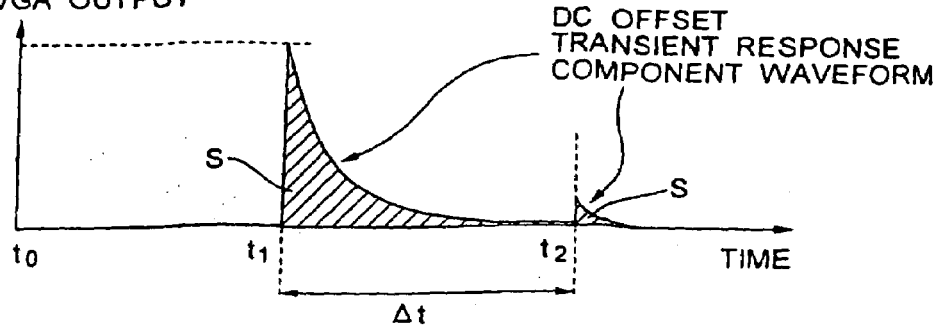

In the present embodiment, therefore, the gain of the VGA 150 is changed from the low gain to the high gain with a delay time Td after the change in the gain of the LNA 120 as represented by a solid line in FIG. 3E. The delay time Td is represented by $Td = t_{31} - t_{21}$. As a result, the transient response component of the DC offset induced at the point in time $t_{21}$ becomes smaller than the transient response component induced in the conventional technique. The delay time Td is larger than 0, and smaller than a repetition period (Δt shown in FIG. 9) of the change in gains of the LNA 120 and the VGA 150.

In this way, the gain of the VGA 150 is changed with a delay to the change in the gain of the LNA 120, in the present embodiment. Therefore, the transient response component of the DC offset can be reduced.

Figure 3F:
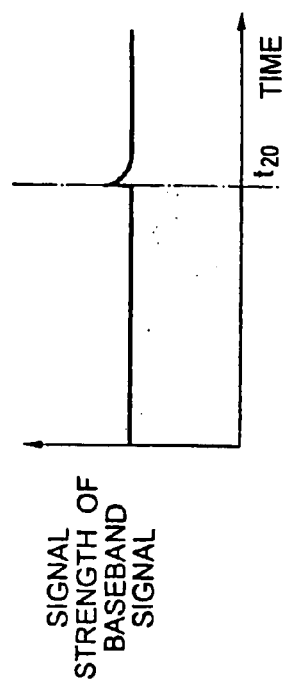

Furthermore, in FIG. 3F, an area $S_B$ of a region surrounded by a straight line L and the solid line is obviously smaller than an area $S_A$ of a region surrounded by the straight line L and the broken line. In the present embodiment, therefore, the DC offset component per unit time is smaller than that in the conventional technique. Since, as described above, the error rate in the reception characteristics is proportionate to an accumulation value of an area S per unit time, the present embodiment has a smaller error rate in the reception performance than that of the conventional technique. In the present embodiment, therefore, the reception performance becomes better than that in the conventional technique.

Although in the present embodiment the gain of the LNA 120 can be changed to two levels, it is also permissible that the gain of the LNA can be changed to three or more levels.

FIGS. 4A to 4H are time charts showing gains of the LNA 120 and VGA 150 in the case where the received electric field strength (so called "RSSI (received signal strength indicator)") changes monotonously, and time charts showing signal strengths of the received signal and signal strengths of the baseband signal. A variant for the embodiment shown in FIGS. 3A to 3F will now be described with reference to FIGS. 4A to 4H.

First, the case where the signal strength of the received signal supplied from the antenna 110 falls between a point in time $t_{10}$ and a point in time $t_{30}$ as shown in FIG. 4A will now be described. The gain of the VGA 150 gradually rises stepwise from the point in time $t_{10}$ as shown in FIG. 4C under the feedback control of the gain controller 160. As a result, the amplification factor for the received signal rises even if the signal strength of the received signal falls. Therefore, the signal strength of the baseband signal is kept constant as shown in FIG. 4D.

However, there is an upper limit in the gain of the VGA 150. If the gain of the VGA 150 arrives at a vicinity of its upper limit at the point in time $t_{20}$, therefore, the gain of the LNA 120 is changed from the low gain to the high gain as shown in FIG. 4B, and the gain of the VGA 150 is changed from the high gain to the low gain as shown in FIG. 4C. The gain change widths of the LNA 120 and the VGA 150 are nearly equal to each other. As a result, the fall in the gain of the VGA 150 can be compensated by the increase in the gain of the LNA 120. The transient response characteristic of the DC offset induced at this time is relatively small as shown in FIG. 4D. In the present embodiment, the gain of the VGA 150 is changed in a larger number of steps as compared with the gain of the LNA 120 as shown in FIGS. 4B, 4C, 4F and 4G. Even if the received signal strength changes linearly as shown in FIG. 4A, therefore, the signal strength of the baseband signal can be kept constant in the present embodiment.

Between the points in time $t_{20}$ and $t_{30}$, the signal strength of the received signal further continues to fall. In such a case, the signal strength of the baseband signal can be kept constant by making the gain of the VGA 150 further rise stepwise. In FIG. 4D and FIG. 4H described later, the transient response component of the DC offset caused by the stepwise gain switching of the VGA 150 is omitted, because it is small.

Subsequently, the case where the signal strength of the received signal rises between a point in time $t_{11}$ and a point in time $t_{31}$ as shown in FIG. 4E will now be described. The gain of the VGA 150 gradually falls stepwise from the point in time $t_{11}$ as shown in FIG. 4G under the feedback control of the gain controller 160. As a result, the amplification factor for the received signal falls even if the signal strength of the received signal rises. Therefore, the signal strength of the baseband signal is kept constant as shown in FIG. 4H.

However, there is a lower limit in the gain of the VGA 150. If the gain of the VGA 150 arrives at a vicinity of its lower limit at the point in time $t_{21}$, therefore, the gain of the LNA 120 is changed from the high gain to the low gain as shown in FIG. 4F. If at this time the gain of the VGA 150 is changed simultaneously with the change in the gain of the LNA 120, a large transient response component of the DC offset occurs at the point in time $t_{21}$ as represented by a broken line in FIG. 4H.

In the present variant, the gain of the VGA 150 is changed from the low gain to the high gain with a delay time Td after the change in the gain of the LNA 120 as represented by a solid line in FIG. 4G. At this time, the gain change widths of the LNA 120 and the VGA 150 are nearly equal to each other. The delay time Td is represented by $Td=t_{31}-t_{21}$. As a result, a transient response component of the DC offset induced at the point in time $t_{21}$ becomes smaller as compared with the transient response component in the conventional technique as shown in FIG. 4H. The delay time Td is a value that is larger than 0 and that is smaller than a repetition period ($\Delta t$ shown in FIG. 9) of the change in gains of the LNA 120 and the VGA 150.

Between the points in time $t_{21}$ and $t_{31}$, the signal strength of the received signal further continues to rise. In this case, the signal strength of the baseband signal can be kept constant by making the gain of the VGA 150 fall gradually.

Thus, in the present variant, the gain of the VGA 150 is changed with a delay to the change in the gain of the LNA 120, and consequently effects similar to those of the embodiment shown in FIGS. 3A to 3F can be obtained.

In the conventional technique, the gain of the VGA 150 is changed between the points in time $t_{21}$ and $t_{31}$ as represented by a broken line in FIG. 4G. This means that the gain of the VGA 150 is being controlled when the transient response component of the DC offset is occurring. Therefore, the gain of the VGA 150 is changed largely at the point in time $t_{21}$.

On the other hand, in the present variant, the gain of the VGA 150 is not changed during the delay time Td, i.e., between the points in time $t_{21}$ and $t_{31}$. As a result, the width of the gain of the VGA 150 changed at the point in time $t_{31}$ in the present variant is smaller than that at the point in time $t_{21}$ in the conventional technique. Therefore, the transient response component of the DC offset induced in the present variant is relatively small. Furthermore, according to the embodiment shown in FIGS. 3A to 3F, the width of the gain of the VGA 150 changed at the point in time $t_{31}$ is equal to that changed at the point in time $t_{21}$ in the conventional technique. Therefore, a peak $P_2$ of the transient response component of the DC offset induced at the point in time $t_{31}$ in the present variant becomes further smaller than a peak $P_1$ of the transient response component induced at the point in time $t_{31}$ in the embodiment shown in FIGS. 3A to 3F.

In the present variant, the gain of the VGA 150 is changed singly without changing the gain of the LNA 120 in some cases. In this case, however, the transient response component of the DC offset is relatively small similarly as in FIG. 4D, and consequently no problems are posed.

Figure 5:
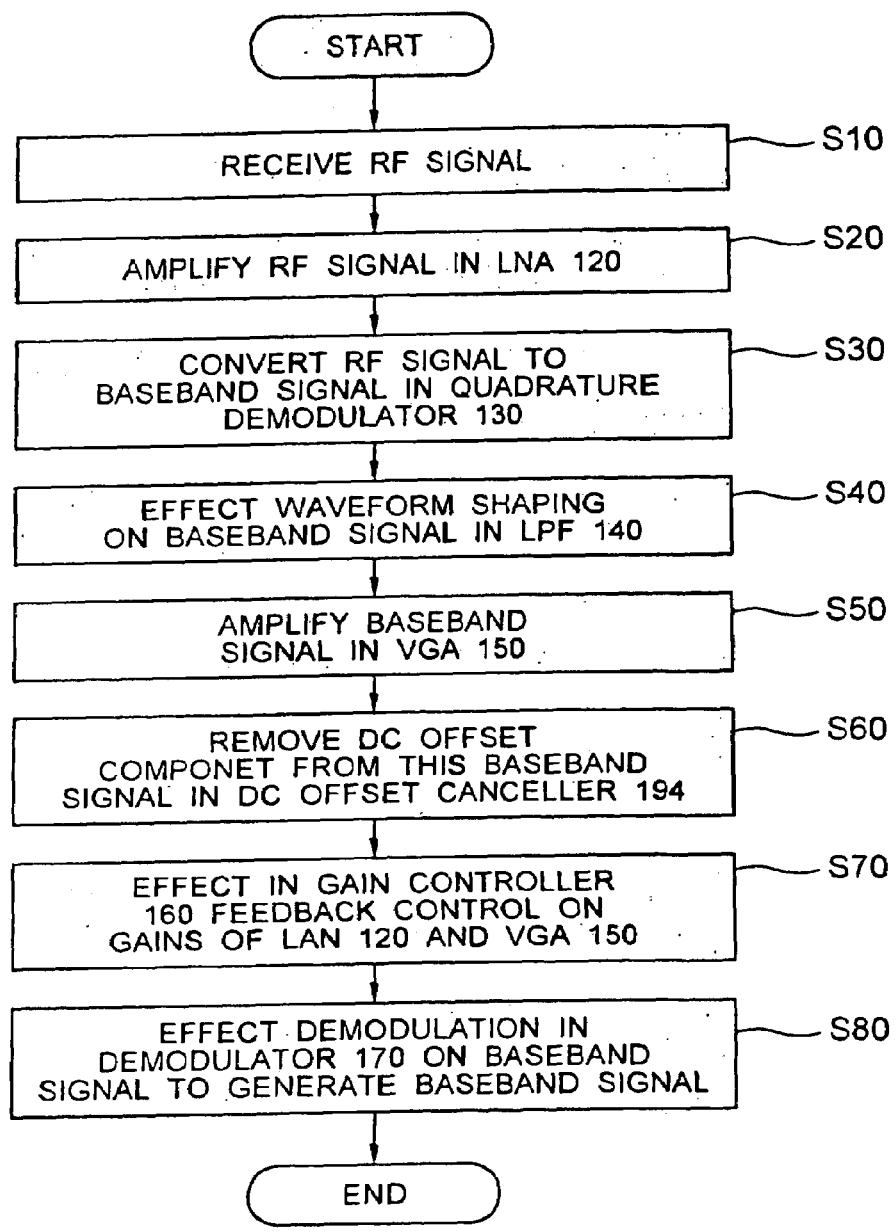
FIG. 5 is a flow diagram showing operation of a radio receiver in an embodiment.

FIG. 5 is a flow diagram showing operation of the radio receiver 100 in the embodiment. An RF signal is received by the antenna 110 (S10). The received signal is amplified by the LNA 120 (S20). The quadrature demodulator 130 converts the RF signal having a high frequency to the baseband signal (S30). The baseband signal is subjected to waveform shaping in the LPF 140 (S40), and amplified in the VGA 150 (S50). The DC offset canceller 194 removes the DC offset component from this baseband signal (S60). The gain controller 160 is supplied with the baseband signal output from the VGA 150, and the gain controller 160 effects feedback control on the LNA 120 and the VGA 150 (S70). In addition, the demodulator 170 demodulates the baseband signal to the digital signal (S80).

Figure 6:
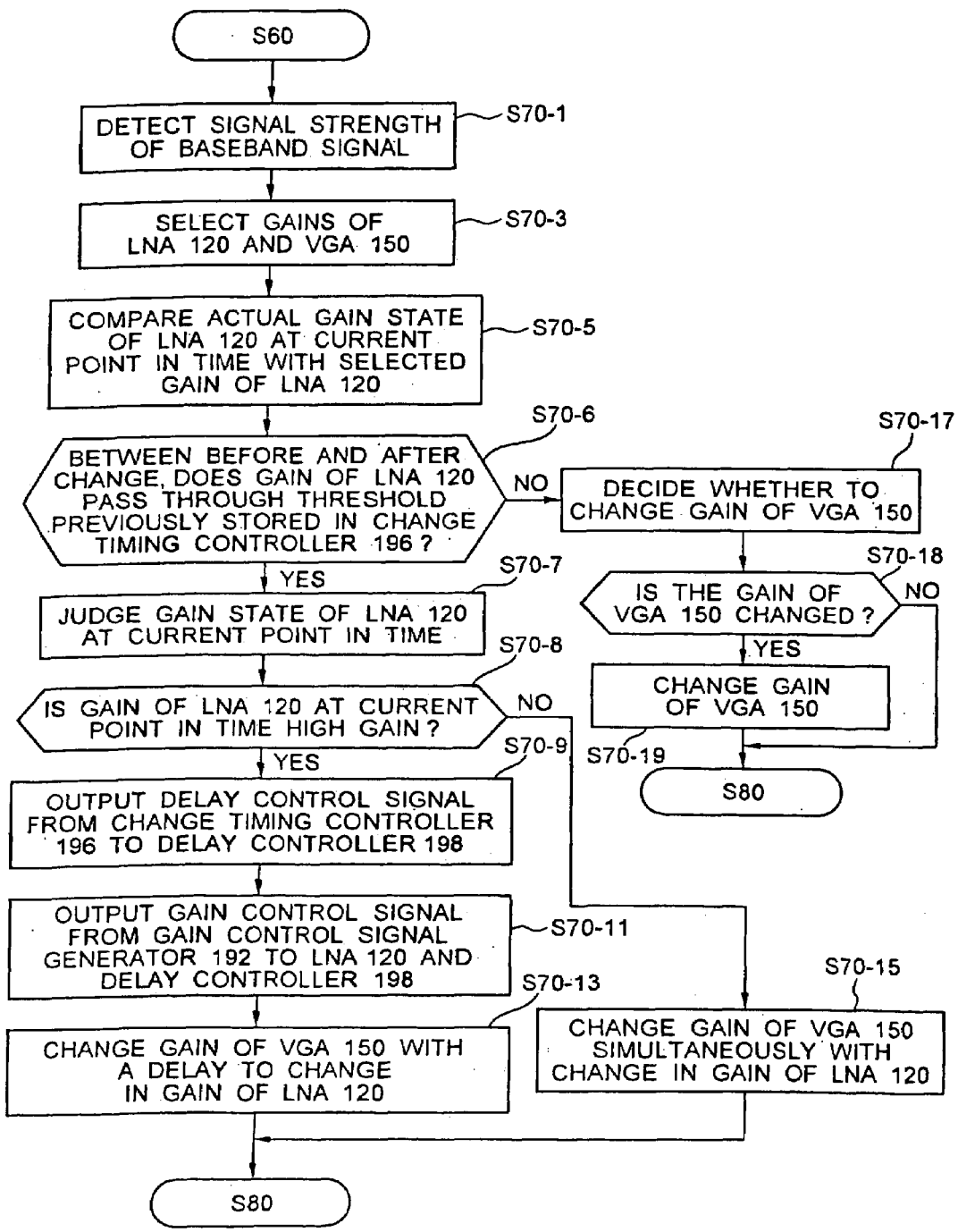
FIG. 6 is a flow diagram showing details of operation of a gain controller 160 at a step S70.

FIG. 6 is a flow diagram showing details of operation conducted by the gain controller 160 at the step S70. If the baseband signal is input to the gain controller 160, the signal strength detector 180 detects the signal strength of the baseband signal (S70-1).

Subsequently, the gain selector 190 selects gains of the LNA 120 and the VGA 150 so as to keep the signal strength of the baseband signal constant (S70-3). Subsequently, the change timing controller 196 compares the actual gain state of the LNA 120 at the current point in time with the selected gain of the LNA 120 (S70-5). As a result of this comparison, it is determined whether the gain of the LNA 120 passes through a threshold previously stored in the change timing controller 196 before and after a change (S70-6).

If the gain of the LNA 120 passes through this threshold before and after the change, the change timing controller 196 furthermore judges the gain state of the LNA 120 at the current point in time (S70-7). Judgment on the gain state of the LNA 120 can be conducted by determining whether the gain of the LNA 120 is higher than this threshold (S70-8). If the gain of the LNA 120 at the current point in time is the high gain as a result of this decision, the change timing controller 196 outputs the delay control signal to the delay controller 198 (S70-9).

Subsequently, the gain control signal generator 192 outputs the gain control signal to the LNA 120 and the delay controller 198 on the basis of the gains of the LNA 120 and the VGA 150 selected by the gain selector 190 (S70-11). The delay controller 198 is supplied with the gain control signal and the delay control signal, and the delay controller 198 delays the gain control signal and outputs the delayed gain control signal to the VGA 150. As a result, the gain of the VGA 150 is changed with a delay to the change in the gain of the LNA 120 (S70-13).

If the gain of the LNA 120 at the current point in time is the low gain at the step S70-8, the change timing controller 196 does not output the delay control signal. Since the delay control signal is not output, the delay controller 198 outputs the gain control signal to the VGA 150 without delaying it. As a result, the gain of the VGA 150 is changed simultaneously with a change in the gain of the LNA 120 (S70-15).

If the gain of the LNA 120 does not pass through the threshold before and after the change at the step S70-6, the delay control signal is not output. The change timing controller 196 further makes a decision whether to change the gain of the VGA 150 (S70-17). In this decision, the gain comparator 201 previously stores a threshold located between the low gain and the high gain of the VGA 150, and judges a gain higher than the threshold to be the high gain and judges gain lower than the threshold to be the low gain. If the gain of the VGA 150 passes through this threshold before and after the change, the change timing controller 196 decides to change the gain of the VGA 150 (S70-18).

If the gain of the VGA 150 is decided to be changed, the gain control signal generator 192 outputs the gain control signal to the VGA 150 via the delay controller 198 to change the gain of the VGA 150. Since the delay control signal is not issued from the change timing controller 196, the delay controller 198 passes the gain control signal to the VGA 150 without delaying it. As a result, the gain of the VGA 150 is changed (S70-19).

If the gain of the VGA 150 is decided not to be changed, the delay controller 198 does not change the gain of VGA 150.

Figure 7:
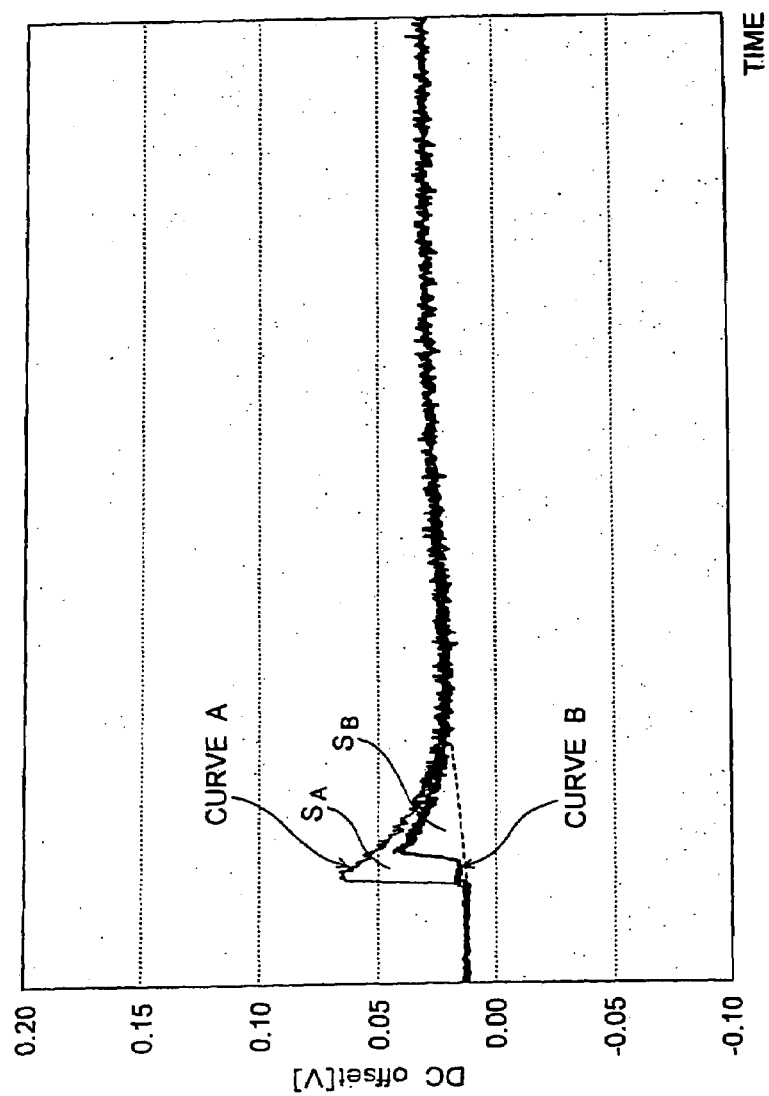
FIG. 7 is a graph showing a DC offset component induced when the gain of the LNA 120 is changed from a high gain to a low gain and the gain of the VGA 150 is changed from a low gain to a high gain.
Figure 8:
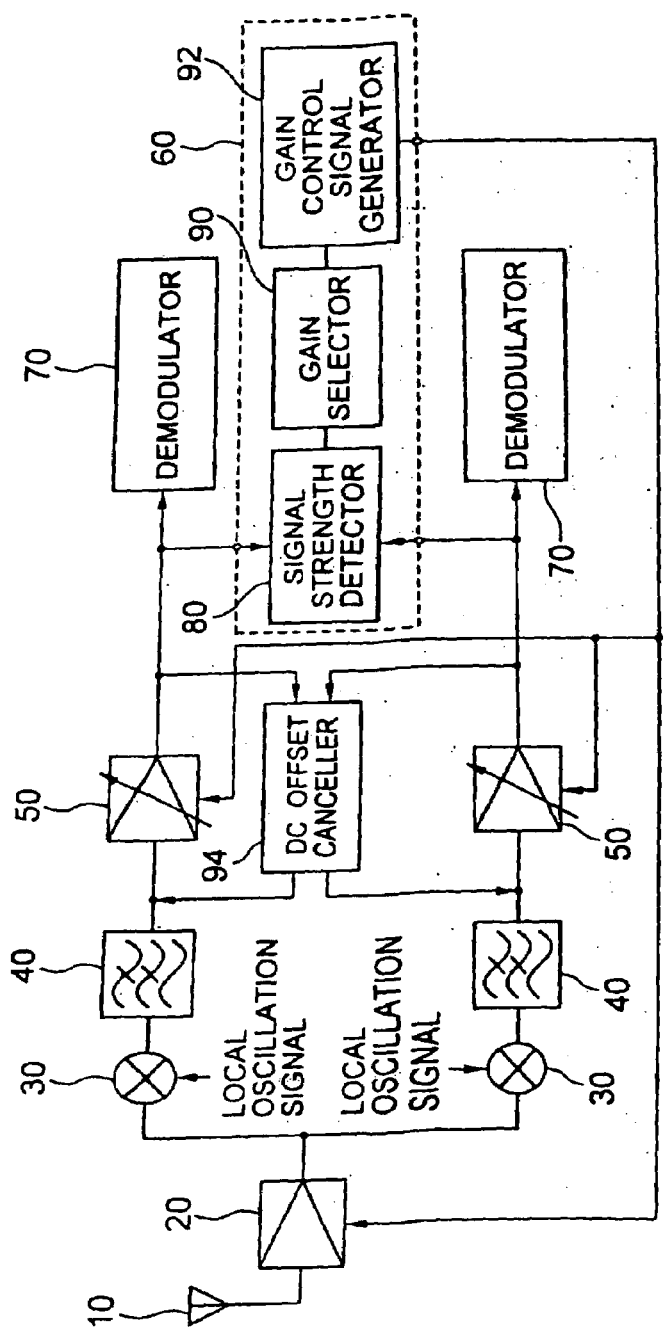
FIG. 8 is a block diagram of a conventional receiver.

FIG. 7 is a graph showing a DC offset component actually measured when the gain of the LNA 120 is changed from the high gain to the low gain and the gain of the VGA 150 is changed from the low gain to the high gain. FIG. 7 corresponds to the graph shown in FIG. 4H in which the signal strength of the baseband signal has been obtained by actually measuring it. A curve A shows a DC offset component measured when the gain of the LNA 120 and the gain of the VGA 150 are changed simultaneously in the same way as the conventional technique. A curve B shows a DC offset component measured when the gain of the VGA 150 is changed with a delay to a change in the gain of the LNA 120 according to the embodiment. These graphs are data showing actual measured results obtained when an RF signal from a signal generator is input to the LNA 120 and a baseband signal output from the VGA 150 is observed on a digital oscilloscope.

In the curve A, the transient response component of the DC offset output from the VGA 150 is approximately 70 mV maximum. On the other hand, in the curve B, the transient response component of the DC offset output from the VGA 150 is approximately 30 mV maximum. Therefore, the transient response component in the curve B is obviously lower than the transient response component in the curve A.

In the case where a threshold is provided for the DC offset component, the probability in the embodiment that the DC offset component exceeds the threshold becomes lower as compared with the conventional technique.

An area $S_B$ of a region surrounded by a curve B and a broken line is obviously smaller than an area $S_A$ of a region surrounded by a curve A and the broken line. In the embodiment, therefore, the DC offset component per unit time is smaller as compared with the conventional technique. Since the error rate in the reception characteristic is proportionate to the accumulation value of the area S per unit time as described earlier, the error rate in the reception characteristic in the embodiment is smaller as compared with the conventional technique. As a result, the embodiment becomes better in reception performance than the conventional technique.

Other embodiments of the present invention will be apparent to those skilled in the art from consideration of the specification and practice of the invention disclosed herein. It is intended that the specification and example embodiments will be considered as exemplary only, with a true scope and spirit of the invention being indicated by the following.

What is claimed is:

1. A radio receiver comprising:
    a first amplifier to amplify a received radio signal;
    a demodulation circuit line comprising a quadrature demodulator to demodulate the radio signal amplified by said first amplifier and to generate a baseband signal, a second amplifier to amplify the baseband signal, and a demodulator to demodulate the baseband signal amplified by said second amplifier; and
    a gain controller to control timing of a change in a gain of said second amplifier, in case that the gain of said first amplifier and the gain of said second amplifier are changed, on the basis of a gain of said first amplifier before and after the change,
    wherein in a case that the gain of said first amplifier is changed from a high gain to a low gain and the gain of said second amplifier is changed from a low gain to a high gain, said gain controller delays timing of the change in the gain of said second amplifier as compared with timing of the change in the gain of said first amplifier.

2. The radio receiver according to claim 1, wherein in a case that the gain of said first amplifier is changed from the low gain to the high gain and the gain of said second amplifier is changed from the high gain to the low gain, said gain controller changes the gain of said second amplifier nearly simultaneously with a change in the gain of said first amplifier.

3. The radio receiver according to claim 1, wherein a delay time is shorter than a repetition period of the changes in the gain of said first amplifier and the gain of said second amplifier, said delay time being a period from the change in the gain of said first amplifier till the change in the gain of said second amplifier.

4. A radio receiver comprising:
    a first amplifier to amplify a received radio signal;
    a demodulation circuit line comprising a quadrature demodulator to demodulate the radio signal amplified by said first amplifier and to generate a baseband signal, a second amplifier to amplify the baseband signal, and a demodulator to demodulate the baseband signal amplified by said second amplifier; and
    a gain controller to control timing of a change in a gain of said second amplifier, in case that the gain of said first amplifier and the gain of said second amplifier are changed, on the basis of a gain of said first amplifier before and after the change,
    wherein said gain controller comprises:
        a signal detector to detect a strength of the baseband signal;
        a gain selector to select the gain of said first amplifier and the gain of said second amplifier on the basis of the strength of the baseband signal;
        a timing determination section to compare actual gains of said first amplifier and said second amplifier with the gain of said first amplifier and the gain of said second amplifier selected by said gain selector, and to determine timing of a change in the gain of said second amplifier on the basis of a result of the comparison;
        a control signal generator to generate a control signal to change the gain of said first amplifier and the gain of said second amplifier; and
        a control signal transmitter to transmit the control signal to said second amplifier in accordance with the timing determined by said timing determination section.

5. The radio receiver according to claim 4, wherein
    in a case that said gain controller changes the gain of said first amplifier from the high gain to the low gain and changes the gain of said second amplifier from the low gain to the high gain,
    said timing determination section determines to delay the change timing in the gain of said second amplifier as compared with the change timing in the gain of said first amplifier, and said control signal transmitter serves as a delay circuit to transmit the control signal to said second amplifier a delay after transmission of the control signal to said first amplifier.

6. A radio receiver comprising:
a first amplifier to amplify a received radio signal;
a quadrature demodulator to demodulate the radio signal amplified by said first amplifier and to generate a baseband signal;
a second amplifier to amplify, after changing a gain of said first amplifier, the baseband signal with a gain based on a gain of said first amplifier obtained before and after the change; and
a demodulator to demodulate the baseband signal amplified by said second amplifier,
wherein in a case that the gain of said first amplifier is changed from a high gain to a low gain and the gain of said second amplifier is changed from a low gain to a high gain, timing of the change in the gain of said second amplifier is delayed as compared with timing of the change in the gain of said first amplifier.

7. The radio receiver according to claim 6, wherein a delay time is shorter than a repetition period of the changes in the gain of said first amplifier and the gain of said second amplifier, said delay time being a period from the change in the gain of said first amplifier till the change in the gain of said second amplifier.

8. A radio receiver comprising:
a first amplifier to amplify a received radio signal;
a quadrature demodulator to demodulate the radio signal amplified by said first amplifier and to generate a baseband signal;
a second amplifier to amplify the baseband signal;
a demodulator to demodulate the baseband signal amplified by said second amplifier; and
a gain controller to delay timing of a change in a gain of said second amplifier as compared with timing of a change in a gain of said first amplifier, in a case that the gain of said first amplifier is changed from a high gain to a low gain and the gain of said second amplifier is changed from a low gain to a high gain.

9. The radio receiver according to claim 8, wherein a delay time is shorter than a repetition period of the changes in the gain of said first amplifier and the gain of said second amplifier, said delay time being a period from the change in the gain of said first amplifier till the change in the gain of said second amplifier.

10. A radio signal processing method comprising:
receiving a radio signal;
amplifying the radio signal;
demodulating the amplified radio signal to a baseband signal;
amplifying the baseband signal;
demodulating the amplified baseband signal;
determining timing of a change in a gain of said first amplifier and a gain of said second amplifier, in case that the gain of said first amplifier and the gain of said second amplifier are changed, on the basis of the gain of said first amplifier obtained before and after the change; and
changing the gain of said first amplifier and the gain of said second amplifier in accordance with the determined timing,
wherein: in a case where the gain of said first amplifier is changed from a high gain to a low gain and the gain of said second amplifier is changed from a low gain to a high gain, in a case that the timing of the change in the gain is determined, the gain of said second amplifier is changed with a delay to the change in the gain of said first amplifier.

11. A radio signal processing method according to claim 10,
wherein: in a case where the gain of said first amplifier is changed from a low gain to a high gain and the gain of said second amplifier is changed from a high gain to a low gain, in case that the timing of the change in the gain is determined, the gain of said second amplifier is changed nearly simultaneously with a change in the gain of said first amplifier.

* * * * *